United States Patent
West et al.

(10) Patent No.: US 7,093,177 B2
(45) Date of Patent: Aug. 15, 2006

(54) LOW-JITTER CLOCK FOR TEST SYSTEM

(75) Inventors: Burnell G. West, Fremont, CA (US); Paolo Dalla Ricca, Fremont, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 544 days.

(21) Appl. No.: 10/102,536

(22) Filed: Mar. 19, 2002

(65) Prior Publication Data

US 2003/0005360 A1   Jan. 2, 2003

Related U.S. Application Data (60) Provisional application No. 60/277,795, filed on Mar. 21, 2001, provisional application No. 60/277,675, filed on Mar. 20, 2001.

(51) Int. Cl.
  G01R 31/28   (2006.01)
  G06R 11/00   (2006.01)
(52) U.S. Cl. ..................... 714/738; 324/73.1
(58) Field of Classification Search ............... 714/724, 714/738, 739; 331/1 R, 57; 324/73.1
  See application file for complete search history.

(56) References Cited

U.S. PATENT DOCUMENTS

| | | | |
|---|---|---|---|
| 5,212,443 A | 5/1993 | West et al. | |
| 5,270,643 A * | 12/1993 | Richardson et al. | 324/751 |
| 5,471,176 A * | 11/1995 | Henson et al. | 331/1 A |
| 5,477,139 A | 12/1995 | West et al. | |
| 5,491,673 A | 2/1996 | Okayasu | |
| 5,581,177 A | 12/1996 | Hussey et al. | |
| 5,673,275 A | 9/1997 | Garcia et al. | |
| 6,128,754 A | 10/2000 | Graeve et al. | |
| 6,275,057 B1 | 8/2001 | Takizawa | |

FOREIGN PATENT DOCUMENTS

JP   11038100   12/1999

OTHER PUBLICATIONS

PCT International Search Report, 03/27/2003.

* cited by examiner

*Primary Examiner*—Guy J. Lamarre
(74) *Attorney, Agent, or Firm*—Fish and Richardson P.C.

(57) ABSTRACT

Generating test signals for a device under test (DUT) involves generating a master reference signal, using a vernier technique to generate test pattern signals based on the master reference signal, generating a test clock signal that is phase-matched with and frequency similar to the test pattern signals by providing the master reference signal as input to a phase-locked loop (PLL) and controlling one or more programmable dividers in the PLL to adjust the test clock signal to be a multiple or sub-multiple of a frequency of the test pattern signals, applying the test clock signal to the clock input pin of the DUT, and applying the test pattern signals to data pins of the DUT. When the frequency of the test pattern signals is changed, the test clock signal frequency may be adjusted to calibrate to the changed frequency of the test pattern signals by re-programming the programmable dividers.

36 Claims, 5 Drawing Sheets

LOW-JITTER CLOCK FOR TEST SYSTEM

RELATED APPLICATION

This application claims priority to U.S. Provisional Patent Application No. 60/277,675, filed Mar. 20, 2001, and to U.S. Provisional Patent Application No. 60/277,795, filed Mar. 21, 2001.

BACKGROUND

This application relates to test system clocks used to generate test patterns and clock signals for test circuits, such as integrated circuit devices.

Test systems for testing high-speed integrated-circuit devices (i.e., device under test (DUT)), such as microprocessors, have become increasingly sophisticated due to the need for generating precise clock signals and test pattern signals. The clock signals are provided to a DUT's clock input pin and used to run the DUT, while the test pattern signals are used to drive and strobe the DUT's data pins.

Figure 1:
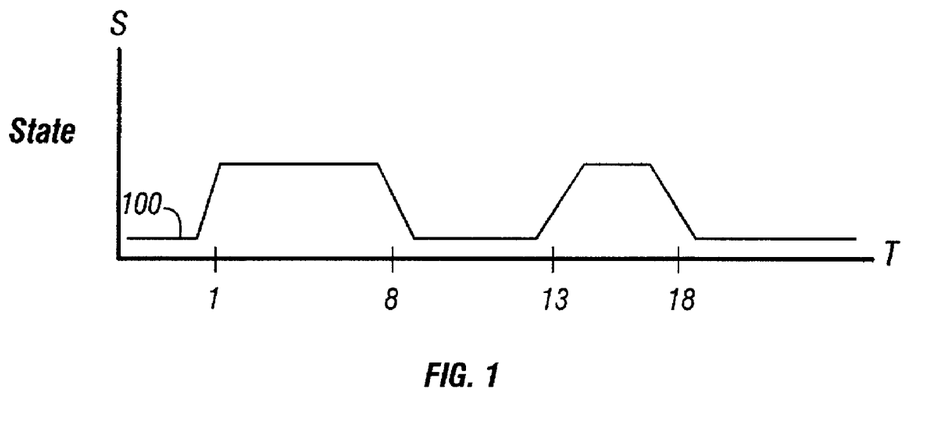
FIG. 1 is a diagram of a test pattern.

Test pattern signals (which are also referred to as "event sequences") generally include a pattern of events, such as binary values (1s and 0s), and an associated time for the occurrence of each event at its rising and falling edges, which is usually referred to as a test period. Events usually are one of two event types—drive events that drive a DUT data pin to a particular state, and strobe events (also called test events) that test the state of a DUT data pin. FIG. 1 illustrates an example of a test pattern 100, such as may be generated for testing a DUT. In this example, the test pattern 100 includes four events. An event is a pair (S,T) where "S" is a state and "T" is the time associated with the transition to the state. For example, test pattern 100 has four drive events which can be written as (D1,1), (D0,8), (D1,13) and (D0,18). The first event is driving the signal to a high state (1) at time equal to 1. The second event is driving the signal to a low state (0) at time 8. The third event is driving to a high state (1) at time 13. The fourth event is driving to a low state (0) at time 18. The test period of the test pattern 100 is the time between time 1 and time 13, which is repeated for successive generations of the drive events.

Figure 2:
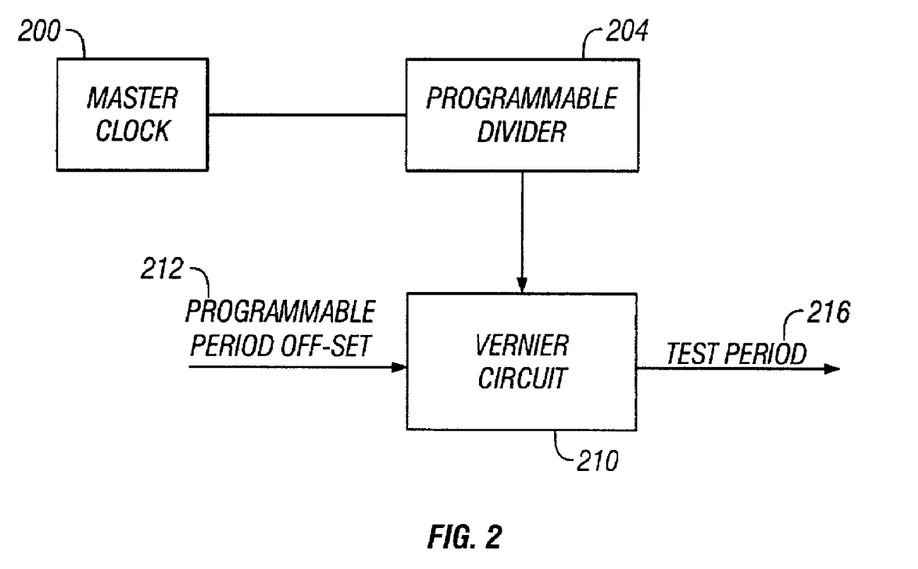
FIG. 2 is a block diagram of a conventional period-vernier circuit for generating test periods.

In developing a test pattern signal, a test system needs a mechanism for generating a pattern of events in which rising and falling edges can be placed at precise times within a chosen test period with reference to the test system's master clock. Assuming the master clock has a period of 2.5 nanoseconds (ns), the test system should be able to place rising/falling edges with a precision on an order of 10 picoseconds (ps). As shown in FIG. 2, generating a test pattern signal with a test period that is a multiple of the master clock 200's period (e.g., 2.5 ns or 5.0 ns) can be done by using a programmable divider 204. Generating a test pattern signal having a test period that is between a multiple of the master clock period (e.g., 2.7 ns or 5.5 ns) can be done by using a vernier technique, which is implemented by a vernier circuit 210, to provide a programmable period off-set 212 (which is referred to as a "period vernier") to the master clock 200's period or multiple of the master clock 200's period. Generally, the period vernier 212 value is used to adjust the master clock period to achieve a desired test period 216 suitable for a particular test pattern signal. Test systems, such as those described in U.S. Pat. Nos. 6,128,754, 5,673,275 and 5,212,443, the disclosures of which are incorporated by reference, describe the use of a vernier technique to generate a period vernier.

Because the vernier technique is a digital approach to frequency synthesis, it generally has certain advantages, such as increased flexibility (i.e., the ability to easily place events in the test periods) and the ability to change period instantaneously during run-time. However, the vernier circuit is inherently analog in nature, and, therefore nonlinear. The vernier circuit's nonlinearity tends to have a large effect on the edge placement accuracy (EPA) of the test period and the period-to-period jitter of the test period. Typically values of the period-to-period jitter can be 20 ps. On a spectrum analyzer, jitter typically shows up as spurs spaced by the frequency at which the vernier-based clock cycles.

A clock signal that is used to run the DUT generally needs to be phase synchronized with and frequency similar to the test pattern signal. Frequency similar means the clock signal is a multiple of a sub-multiple of the test pattern signal. Generally, a vernier-based clock is used to generate the clock signal for the DUT.

SUMMARY

The present inventors recognized that conventional test systems, using a period vernier based clock to generate test pattern signals and clock signals for a DUT, could change clock period instantaneously during run-time, easily move the occurrence of an event within the test period, and provide a clock signal with some period-to-period jitter. The present inventors further recognized that the period-to-period jitter associated with a period vernier based clock can be problematic for certain applications, such as structural testing, that need a low period-to-period jitter clock input to the DUT, in addition to the flexibility of the period vernier based clock for changing the period and moving the occurrence of an event with the period. Consequently, the present inventors developed a low-jitter clock for test systems using period verniers for generating test pattern signals. The present inventors developed the low-jitter clock by using a programmable phase-lock-loop clock that can output a signal that is frequency similar to and phase matched with the generated period vernier based test pattern signals.

Implementations of the test system formatter described here may include various combinations of the following features.

In one aspect, a signal generating apparatus for a test system includes a period vernier test pattern generator programmable to generate test pattern signals using a vernier technique, and a phase-locked-loop clock programmable to output a test clock signal that is frequency-similar (e.g., a multiple or sub-multiple of a frequency of the test pattern signals) to and phase-matched with the test pattern signals generated by the period vernier clock. Each of the period vernier test pattern generator and the phase-locked-loop clock may be programmable to generate corresponding test pattern signals and test clock signals for different types of devices to be tested. Moreover, the period vernier test pattern generator may be programmable to place events in a master period at a precision of about two or more orders of magnitude greater than the master period.

The signal generating apparatus may further include a master timing reference signal supplied to each of the period vernier test pattern generator and the phase-locked-loop clock. The period vernier test pattern generator may include a global sequencer and one or more local sequencers. The phase-locked-loop clock may include a multiplier, a low-pass filter, a voltage controlled oscillator and a feedback portion. The phase-locked-loop clock also may include a programmable delay line and/or a programmable gate, each controllable to re-synchronize the phase-locked-loop clock with the period vernier test pattern generator if an output of the period vernier test pattern generator changes.

The phase-locked-loop clock may include one or more programmable dividers that are controllable to adjust the frequency of the phase-locked-loop clock output. These dividers may include a first divider arranged at a reference input signal side of a phase-locked-loop, a second divider arranged in the feedback portion of the phase-locked-loop, and a third divider arranged at an output side of the phase-locked-loop. In that case, the first divider may be a divide-by-M divider, the second divider may be a divide-by-N divider and the third divider may be a divide-by-D divider, wherein M, N and D are programmable integer coefficients. The frequency of the test clock signal is controllable by choosing M, N and D to select a desired output frequency, Fout, according to the equation $$Fout = Fref * \frac{N}{M*2*D}$$

where Fref is the reference input signal. N may correspond to a period resolution and may be set, for example, to 64. D may correspond to a coarse frequency adjustment and M may correspond to a fine frequency adjustment. In one implementation, D is a power of two.

In another aspect, test signals may be generated by generating test pattern signals using a vernier technique, and generating a test clock signal that is frequency-similar to and phase-matched with the test pattern signals using a phase-locked-loop. The generated test pattern signals and the phase-matched test clock signal may be applied to a device under test. In particular, the generated test pattern signals are applied to data pins of the device under test and the phase-matched test clock signal is applied to the clock input pin of the device under test. The phase-matched test clock signal may be generated by synchronizing the test clock signal to the test pattern signals using the phase-locked loop. Generating a phase-matched test clock signal further may involve generating the test pattern signals and the test clock signal based on a common master clock reference.

Moreover, generating a frequency-similar test clock signal may involve substantially matching the frequency of the test clock signal to a frequency of the test pattern signals. Substantially matching the frequency of the test clock signal may involve controlling one or more programmable dividers to adjust the test clock signal to be a multiple or sub-multiple of the frequency of the test pattern signals. More generally, controlling a frequency of the test clock signal may be accomplished by controlling a plurality of programmable dividers.

When a frequency of the test pattern signals is changed, the frequency of the test clock signal may be adjusted to match the changed frequency of the test pattern signals by re-programming one or more programmable dividers. In that case, the test clock signal may be re-synchronized with the test pattern signals by controlling a delay line or a gate or both to alter a timing of the test clock signal.

In another aspect, generating test signals for a device under test may involve generating a master reference signal, using a vernier technique to generate test pattern signals based on the master reference signal, generating a test clock signal that is phase-matched with and frequency similar to the test pattern signals by providing the master reference signal as input to a phase-locked loop and controlling one or more programmable dividers in the phase-locked-loop to adjust the test clock signal to be a multiple or sub-multiple of a frequency of the test pattern signals, applying the test clock signal to the clock input pin of the device under test, and applying the test pattern signals to data pins of the device under test. When the frequency of the test pattern signals is changed, the frequency of the test clock signal may be adjusted to calibrate to the changed frequency of the test pattern signals by re-programming the one or more programmable dividers. Moreover, the test clock signal may be re-synchronized with the test pattern signals by controlling a delay line or a gate or both to alter a timing of the test clock signal.

The systems and techniques described here may provide several advantages. For example, one has the ability to produce a clock signal with a dependable placement of edges within that signal, for example, on the order of +/−2 picoseconds (ps) with a master clock period of 2.5 nanoseconds (ns). Moreover, one can generate a clock signal with lower period-to-period jitter (e.g., 2 ps), that will not erode timing margin in applications with a sub-nanosecond internal core clock, which is a significant improvement over conventional systems that can have a period-to-period jitter of about 20 ps. The generated clock signal's stability can result in a stable DUT core clock, an improvement in the timing performance of the DUT, and an increase in the testing yield. As a result, the systems and techniques described here are particularly suited for applications, such as structural testing, that require the flexibility of the period vernier for generating test pattern signals for data pins and the low jitter of the phase-lock-loop clock for clock input.

Details of one or more embodiments are set forth in the accompanying drawings and the description below. Other features and advantages will be apparent from the description and drawings, and from the claims.

DRAWING DESCRIPTIONS

Like reference symbols in the various drawings indicate like elements.

DETAILED DESCRIPTION

Figure 3:
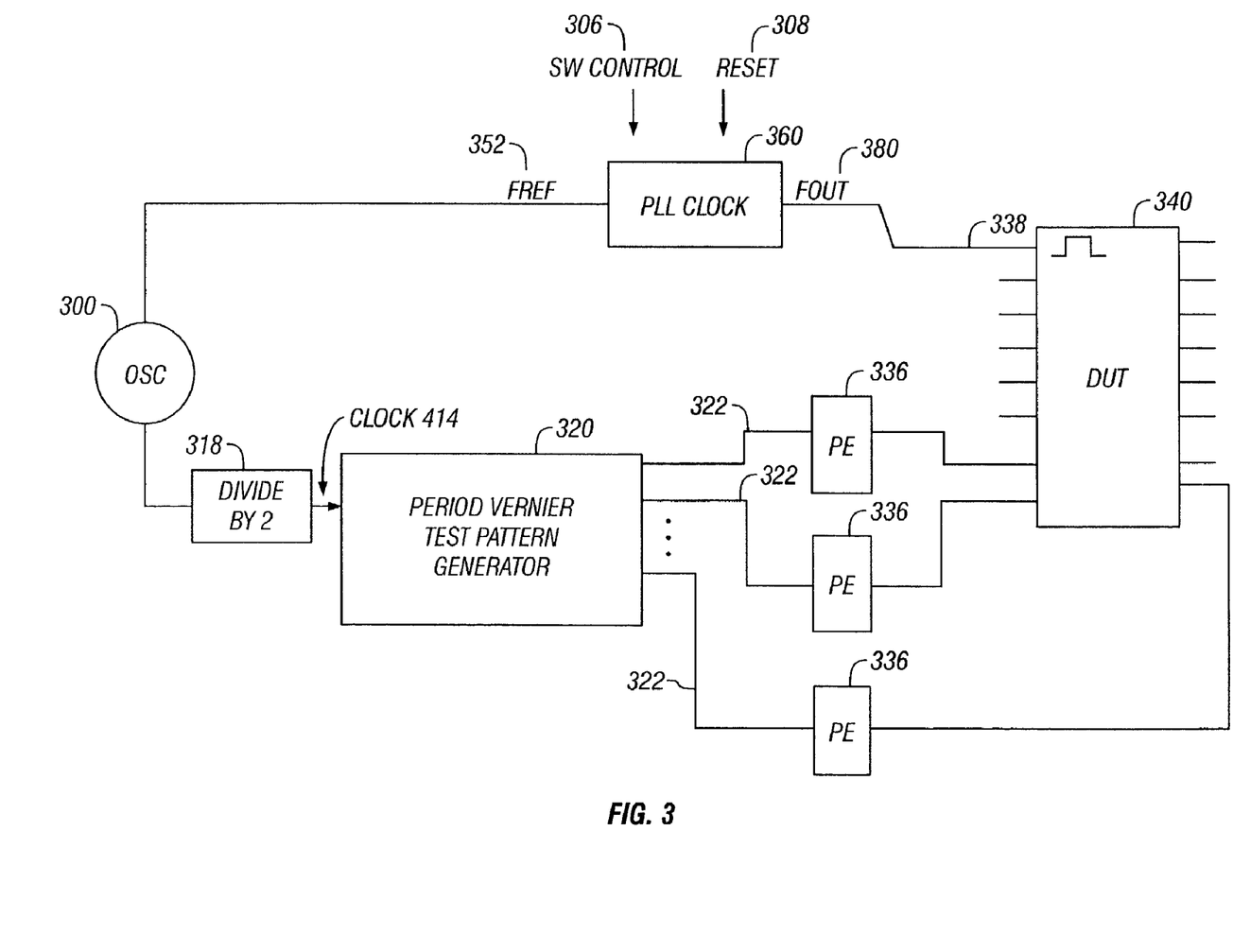
FIG. 3 is a block diagram of a test system using a selectively programmable phase-lock-loop clock and a period-vernier test pattern generator.

FIG. 3 is a block diagram of a test system that, by using a period vernier for generating test pattern signals and a PLL-based clock having a range of programmable frequencies for generating clock signals, can improve edge placement accuracy and can provide a clock signal having low period-to-period jitter to a DUT clock input.

System oscillator (OSC) 300 provides a clock signal to a phase-lock-loop clock (PLL Clock) 360 through input signal Fref 352. The system oscillator 300 also provides a clock signal to a divide-by-2 circuit 318, which divides the clock signal in half. In this particular case, the system oscillator 300 is running at 800 MHz, but other frequencies could be used depending on application and design parameters. The output of the divide-by-2 circuit 318 is the master clock (Clock) 414, which in this case is running at 400 MHz, but other master clock frequencies can be obtained by using a system oscillator running at a different frequency or using a programmable divider instead of the divide-by-2 circuit 318 the value depending on application and design parameters. The Clock 414 is relayed to the Period Vernier Test Pattern Generator 320, which has an input/output line 322 coupled to a separate pin electronics 336 for a particular pin of a DUT 340. The Period Vernier Test Pattern Generator 320 provides test pattern signals through input/out line 322 to pin electronics 336, which are then provided to the data pins of DUT 340. As indicated above, the PLL clock 360 receives the system oscillator signal through signal Fref 352 and a software control signal (SW Control) 306 and a reset signal (Reset) 308. The PLL clock 360 can provide clock signals up to four clock pins per site that can be used either as four single-ended clocks or two differential clocks. Of course, depending on application and design parameters, clock signals can be provided to more than four clock pins per site. In this example, the PLL clock 360 is providing a single clock signal to clock input 338.

Fref 352, in this example, has a frequency of 800 MHz, but other frequencies could be obtained depending on application and design parameters by using, for example, a system oscillator with a different frequency. The PLL clock 360 outputs a PLL clack signal (Fout) 380, which is frequency similar to, and phase matched with, the test pattern signals that are transmitted to the data pins of the DUT 340. As noted above, frequency similar means the signal Fout 380 is a multiple of a sub-multiple of the test pattern signal. The clock input 338 of the DUT 340 receives the signal Fout 380 from the PLL Clock 360.

The combination of the PLL Clock 360 with the Period Vernier Pattern Generator 320, as shown in FIG. 3, is particularly suited for applications, such as structural testing, that could use the flexibility of the vernier technique for providing test data to the data pins of the DUT 340 and the low period-to-period jitter of the PLL technique for clock input to the DUT 340. In structural testing, for example, the internal clock of the DUT 340 needs to be synchronized precisely to a test system clock having low period-to-period jitter for the reasons noted below.

Because most high-speed integrated-circuit devices are driven by an internal PLL clock, the internal PLL clock of the DUT 340 multiplies the clock signal provided by the test system to the clock input 338 (e.g., in conventional systems, a vernier-based clock signal, while in this implementation, the signal Fout 380) to run the core of the DUT 380 at a high frequency. For instance, a 100 MHz test system clock input may be multiplied by a DUT's internal PLL clock to obtain a 1.6 GHz core operation. After the test pattern signals are applied to the data pins of the DUT 340, the state of data pins of the DUT 340 are scanned out and compared to the expected result. Because the core of the DUT 340 runs at 1.6 GHz (i.e., at a period of 625 ps), any period-to-period jitter in the clock signal provided to clock input 338, such as a 20 ps jitter in a vernier-based clock, adversely affects the DUT's internal PLL clock's operation. This can result in a jittery core clock, which ultimately reduces the timing performances of the DUT and possibly impacts the testing yield.

In this implementation, however, the DUT 340 is provided a stable clock signal, Fout 380, i.e., it has lower period-to-period jitter (e.g., 2 ps), that will not erode timing margin in applications with a sub-nanosecond internal core clock. Further, the signal Fout 380 can be made to be frequency similar to, and phase matched with, the test pattern signals that are transmitted to the data pins of the DUT 340. Also, among other advantages, the PLL clock 360 can improve edge placement accuracy compared to an edge placement accuracy provided by a conventional vernier-based clock.

Figure 4:
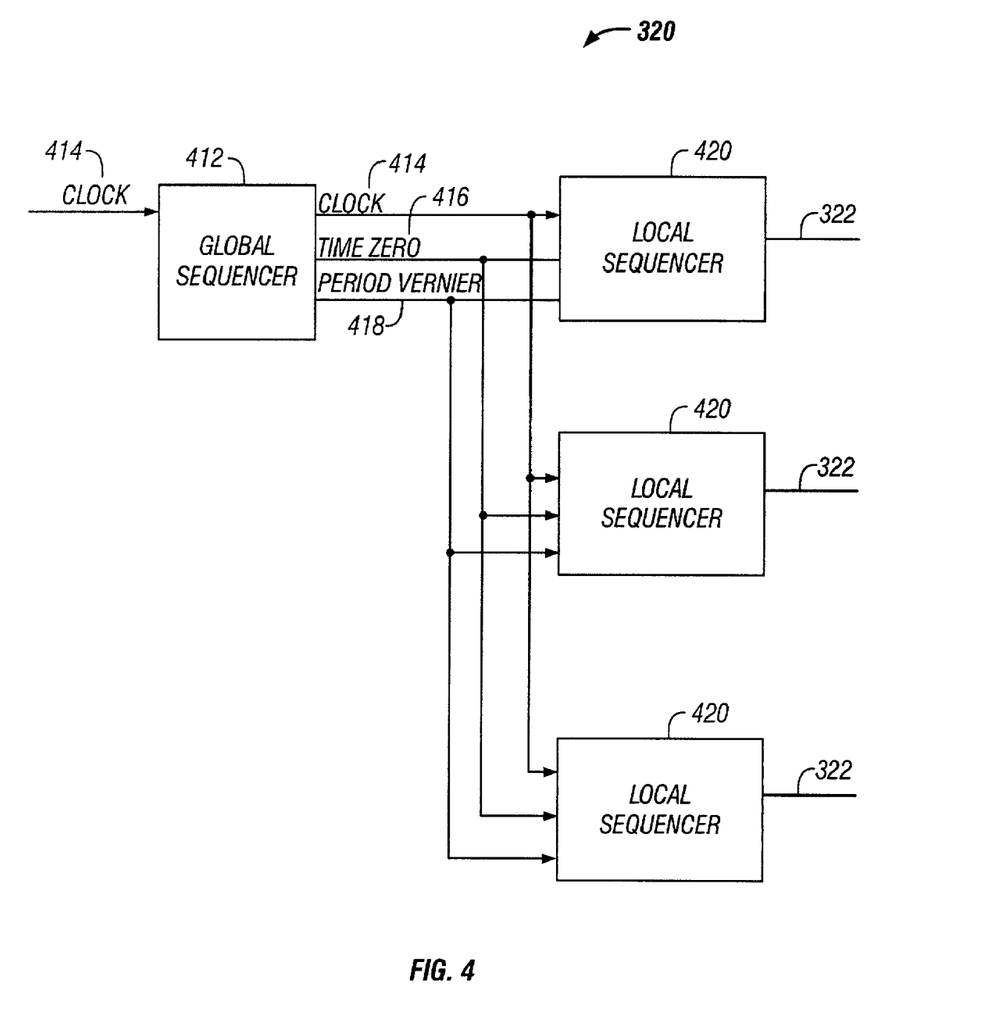
FIG. 4 is a block diagram of a period-vernier test pattern generator.

FIG. 4 shows a block diagram of the Period Vernier Test Pattern Generator 320. A global sequencer 412 receives the master clock (Clock) 414. The global sequencer 412 can be either of the global sequencers disclosed in U.S. Pat. Nos. 5,477,139 and 5,212,443 which are incorporated herein, or any other global sequencer that produces similar output signals that can be used to generate a test period. In the example shown in FIG. 4, the master clock 414 is running at 400 MHz, with a base period of 2.5 ns.

The global sequencer 412 outputs the master clock 414 and a time zero signal 416. The time zero signal 416 is a specified clock pulse edge to which a test period is to be referenced. The global sequencer 412 uses a vernier technique, such as the one disclosed in U.S. Pat. No. 5,477,139, which is incorporated herein, to provide a number of digital bits on lines 418 to indicate an offset from the time zero signal 416 for the beginning of the test period. The offset is referred to as a period vernier or period offset. The period vernier values can be composed of an integer number of master clock cycles plus a fractional part of the master clock. The fractional part, as well as the period resolution of the test period can be provided by, for example, relaying 8 bits of information. Using the period vernier gives the ability to provide a test period resolution which is not limited to the period resolution of the master clock 414. In this example, the period resolution of the master clock at 400 MHz is 9.765625 ps (i.e., 2.5 ns divided by 256).

All of these signals are provided to a number of local sequencers 420, which can be used by the local sequencers disclosed in U.S. Pat. Nos. 6,128,754, 5,477,139 and 5,212, 443, which are incorporated herein, or any other local sequencer known to one of ordinary skill. The local sequencers 420 generate test pattern signals, which include a pattern of events, such as 1s and 0s, and a time for the occurrence of each event (i.e., a test period), which is based on the master clock 414, time zero signal and the period vernier value. Each local sequencer has input/output line 322 coupled to the separate pin electronics 336, which are generally connected to the local sequencer 420 by coaxial cable.

Figure 5:
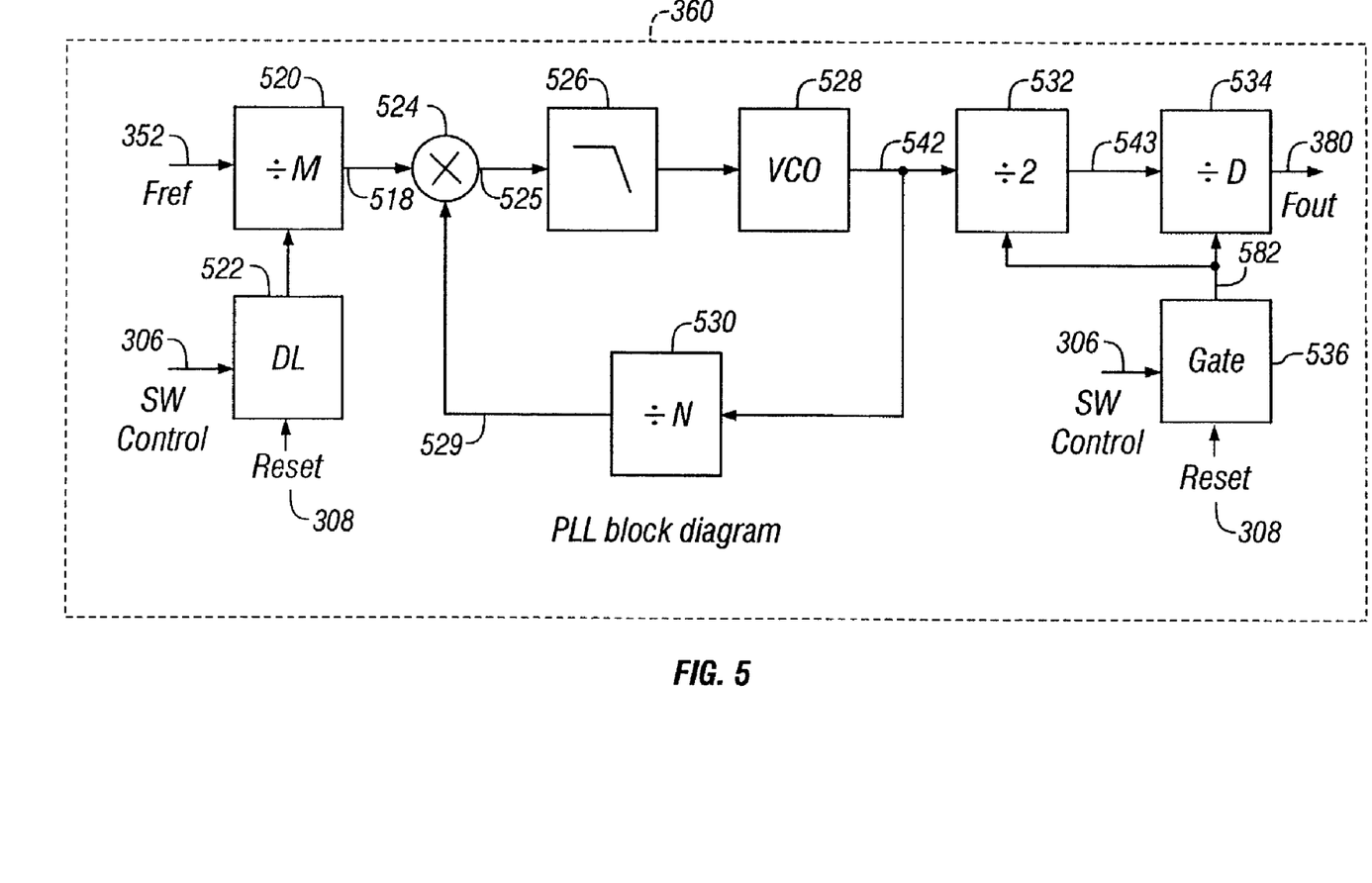
FIG. 5 is a block diagram of a selectively programmable phase-lock-loop clock.

FIG. 5 shows a block diagram of the PLL clock 360, which can generate clock signals at Fout 380 having a range of programmable frequencies. Furthermore, the clock signals at Fout 380 can be made to be frequency similar to, and phase matched with the test pattern signals generated by the Period Vernier Test Pattern Generator 320. Also, as stated above, the PLL clock 360 can achieve improve edge placement accuracy and can provide a clock signal at Fout 380 having low period-to-period jitter.

The PLL clock 360 receives a reference signal (Fref) 352, which is processed by a a programmable divide-by-M circuit 520. The resulting signal (Fref/M) 518 is received by a multiplier 524, which also receives a feedback signal 529 from a programmable divide-by-N circuit 530. The resulting signal 525 is transmitted to a low-pass filter 526. The filtered signal is transmitted to a voltage controlled oscillator (VCO) 528. The output of the VCO (VCO out) 542 is feedback to the programmable divide-by-N circuit 530 and transmitted to a divide-by-2 circuit 532 and a programmable divide-by-D circuit 534, which outputs the clock signal at Fout 380, which is frequency similar to and phase matched with the test pattern signals generated by the Period Vernier Test Pattern Generator 320. Frequency synthesis and phase matching can be accomplished by using a reset signal (Reset) 308 and a SW Control 306, which provides a software calibrated timing delay, with a Delay Line (DL) 522 and a Gate 526. Frequency synthesis and phase matching are explained in further detail below.

Frequency Synthesis

The PLL clock 360 receives the signal Fref 352, which, in this example, has a period of 1.25 ns (i.e., 800 Mhz), but other frequencies could be used depending on application and design parameters. The frequency of the signal Fout 380 can be calculated according to equation (1):

$$Fout = Fref * \frac{N}{M*2*D},$$

where Fref is the reference clock signal frequency, N and M are programmable coefficients, and D is a programmable coefficient of programmable divider 534, which can be 1, 2, 4, 8, 16 or 32 or any power of 2 depending on application and design parameters. The period of the signal Fout 380 can be calculated according to equation (2):

$$Tout = Tref * \frac{M*2*D}{N}.$$

Equation (2) shows that the period resolution for the PLL clock 360 depends on the value of N, while the period duration (i.e., frequency range) is affected by the value of M and D. In this implementation, the minimum required period resolution for the PLL clock 360 is 39.0625 ps. Because $T_{ref}$ is 1.25 ns, one can get the required resolution by setting N to be 64 with M and D set to 1. If a different period resolution for the PLL clock 360 is desired, N can be set to 32, for example, with M and D set to 1 and $T_{ref}$ at 1.25 ns, to achieve a period resolution of 78.125 ps. After defining the minimum period resolution for the PLL clock 360 (e.g., 39.0625 ps), the frequency range of the PLL clock 360 can be defined by setting the M and D coefficients.

In this implementation, the desired frequency range of the signal Fout 380 is 200 to 400 MHz given the master clock 414 received by the Period Vernier Test Pattern Generator 320 is running at 400 MHz. Using equation (1), the M coefficient has a value of 64 if Fout 380 is 400 MHz, Fref 352 is 800 MHz, N is 64, and D is 1. The D coefficient of the programmable divider 534 is set to 1 because no division is required for the desired frequency range of the signal Fout 380. Likewise, the M coefficient has a value of 128 if Fout 380 is 200 MHz, Fref 352 is 800 MHz, N is 64, and D is 1. Therefore, M has a value between 64 and 128. By varying the D coefficient of the programmable divider 534, generating a wide range of clock frequencies is possible. Table 1 shows clock periods that can be obtained as a function of M and D, with N fixed at 64.

As can be seen in Table 1, division of the PLL clock 360 by varying the D coefficient of the programmable divider 534 will proportionately affect the frequency resolution. Nevertheless, frequency synchronization with the test pattern signals generated by the Period Vernier Test Pattern Generator 320 can be accomplished by choosing the proper M and D given a desired N. As can be seen, the clock periods that can be generated by the PLL clock 360 are a multiple of the test periods generated by the Period Vernier Test Pattern Generator 320. As can be seen, the clock periods that can be generated by the PLL clock 360 are a multiple of the test periods generated by the Period Vernier Test Pattern Generator 320.

TABLE 1

Period in ns as a function of M and D

|   |     | D      |          |          |          |
|---|-----|--------|----------|----------|----------|
|   |     | 1      | 2        | 4        | 8        |
|   | 64  | 2.5    | 5        | 10       | 20       |
|   | 65  | 2.5390625 | 5.078125 | 10.15625 | 20.3125 |
|   | 66  | 2.578125 | 5.15625 | 10.3125 | 20.625 |
|   | 67  | 2.6171875 | 5.234375 | 10.46875 | 20.9375 |
|   | 68  | 2.65625 | 5.3125 | 10.625 | 21.25 |
|   | 69  | 2.6953125 | 5.390625 | 10.78125 | 21.5625 |
|   | 70  | 2.734375 | 5.46875 | 10.9375 | 21.875 |
|   | 71  | 2.7734375 | 5.546875 | 11.09375 | 22.1875 |
|   | 72  | 2.8125 | 5.625 | 11.25 | 22.5 |
|   | 73  | 2.8515625 | 5.703125 | 11.40625 | 22.8125 |
| M | 74  | 2.890625 | 5.78125 | 11.5625 | 23.125 |
|   | 75  | 2.9296875 | 5.859375 | 11.71875 | 23.4375 |
|   | 76  | 2.96875 | 5.9375 | 11.875 | 23.75 |
|   | 77  | 3.0078125 | 6.015625 | 12.03125 | 24.0625 |
|   | 78  | 3.046875 | 6.09375 | 12.1875 | 24.375 |
|   | 79  | 3.0859375 | 6.171875 | 12.34375 | 24.6875 |
|   | 80  | 3.125 | 6.25 | 12.5 | 25 |
|   | 81  | 3.1640625 | 6.328125 | 12.65625 | 25.3125 |
|   | 115 | 4.4921875 | 8.984375 | 17.96875 | 35.9375 |
|   | 116 | 4.53125 | 9.0625 | 18.125 | 36.25 |
|   | 117 | 4.5703125 | 9.140625 | 18.28125 | 36.5625 |
|   | 118 | 4.609375 | 9.21875 | 18.4375 | 36.875 |
|   | 119 | 4.6484375 | 9.296875 | 18.59375 | 37.1875 |
|   | 120 | 4.6875 | 9.375 | 18.75 | 37.5 |
|   | 121 | 4.7265625 | 9.453125 | 18.90625 | 37.8125 |
|   | 122 | 4.765625 | 9.53125 | 19.0625 | 38.125 |
|   | 123 | 4.8046875 | 9.609375 | 19.21875 | 38.4375 |
|   | 124 | 4.84375 | 9.6875 | 19.375 | 38.75 |
|   | 125 | 4.8828125 | 9.765625 | 19.53125 | 39.0625 |
|   | 126 | 4.921875 | 9.84375 | 19.6875 | 39.375 |
|   | 127 | 4.9609375 | 9.921875 | 19.84375 | 39.6875 |
|   | 128 | 5 | 10 | 20 | 40 |

Phase Alignment

Phase alignment of the signal Fout 380 and the test pattern signals can be achieved by a two-step process: First, the divide-by-M circuit 520 is reset with proper calibration; then the signal Fout 380 is phase-aligned with the test pattern (which is generated by the Period Vernier Test Pattern Generator 320) after the transient out of the VCO 526, which takes place after resetting, has expired.

At each divider 520, 532, 534 phase information is lost (except for the feedback divide-by-N circuit 530 because this circuit multiplies the signal out of the VCO (VCO out) 542). The loss of phase information usually occurs unless the divide-by-M circuit 520 is precisely reset at the beginning of every test. Resetting the divide-by-M circuit 520 can be accomplished by using a reset signal (Reset) 308. A software controlled delay line DL 522 can be used to compensate for any delay in the reset logic that generates the reset signal 308 and guarantees that the reset signal 308 is provided to the divide-by-M circuit 530 at the right time. The timing calibration or timing delay value is introduced to the DL 522 through signal SW Control 306.

Phase aligning the output of the PLL clock 360 with the test pattern after the transient out of VCO 526 expires can be accomplished by a phase comparator (not shown). As mentioned above, because a clean and repeatable signal Fout 380 is generally desired, the transient needs to be masked. This can be accomplished by a gate signal 582, which can be generated by the gate 536. The gate signal 582 is synchronized with the signal Fref/M 518 and signal Fout 380 through use of the reset signal 308 and the timing calibration or timing delay value, which is introduced to the gate 536 through signal SW Control 306. Once the timing calibration has been defined for a particular frequency, it can be calculated for all the other frequencies. One of ordinary skill would know ho to calculate these other frequencies using known techniques.

Figure 6:
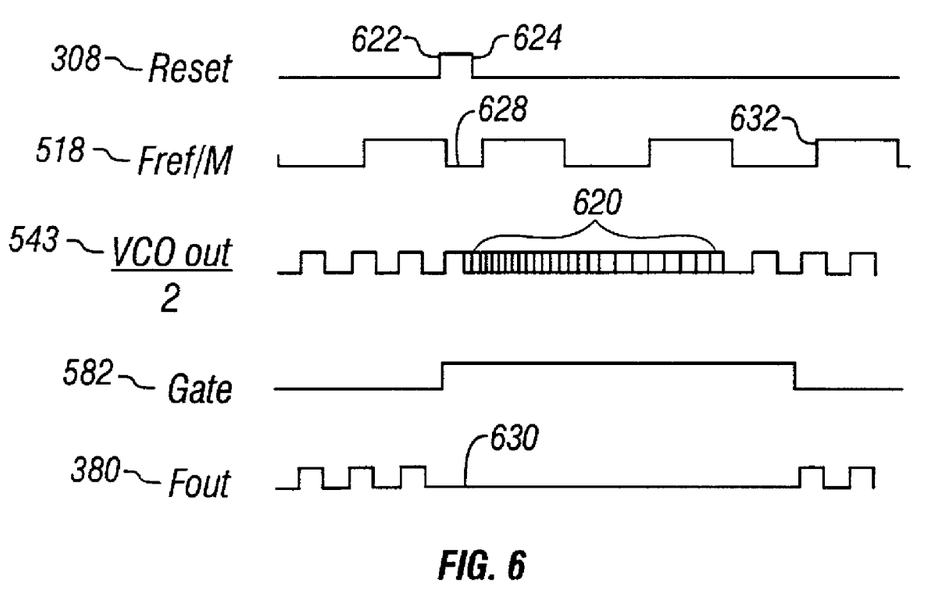
FIG. 6 is a timing diagram illustrating the timing signals used and generated by the phase-lock-loop clock.

FIG. 6 shows the timing of the reset of Fout 380 to obtain a fixed time relation with the reset signal 308 which in turn is phase aligned with the test pattern generated by the Period Vernier Test Pattern Generator 320. As can be seen, on the reset signal's rising edge 622 the signal Fref/M 518 drives to a low state 628. The signal Fref/M 518 remains in a low state 628 until the reset signal's falling edge 624. Furthermore, on the reset signal's rising edge 622, the gate signal 582 drives to the high state 626, which drives the signal Fout 380 to a low state 630. The gate signal 582 remains in a high state 626 at least until the transient 620 in the signal VCOout/2 543 expires, after which time the gate signal 582 drives to a low state in synchrony with the signal Fout 380. As a result, the test pattern and the signal Fout 380 are phase aligned.

The foregoing implementation combines the flexibility of the period vernier-based test pattern signal generator with the low period-to-period jitter of a PLL-based clock. Such a combination provides the DUT with a stable clock that will not erode timing margin in applications with a sub-nanosecond core clock.

The computational aspects described here can be implemented in digital electronic circuitry, or in computer hardware, firmware, software, or in combinations of them. Where appropriate, aspects of these systems and techniques can be implemented in a computer program product tangibly embodied in a machine-readable storage device for execution by a programmable processor; and method steps can be performed by a programmable processor executing a program of instructions to perform functions by operating on input data and generating output.

To provide for interaction with a user, a computer system can be used having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Other embodiments are within the scope of the following claims.

What is claimed is:

1. A signal generating apparatus for a test system, the apparatus comprising:
   a period vernier test pattern generator programmable to generate test pattern signals using a vernier technique; and
   a phase-locked-loop clock programmable to output a test clock signal that is frequency-similar to and phase-matched with a predetermined cycle of the test pattern signals generated by the period vernier clock.

2. The apparatus of claim 1 wherein each of the period vernier test pattern generator and the phase-locked-loop clack is programmable to generate corresponding test pattern signals and test clock signals for different types of devices to be tested.

3. The apparatus of claim 2 wherein the period vernier test pattern generator is programmable to place events in a master period at a precision of about two or mare orders of magnitude greater than the master period.

4. The apparatus of claim 1 wherein the frequency-similar test clock signal is a multiple of a sub-multiple of a frequency of the test pattern signals.

5. The apparatus of claim 1 wherein the period vernier test pattern generator comprises a global sequencer and one or more local sequencers.

6. The apparatus of claim 5 wherein the phase-locked-loop clock comprises a multiplier, a low-pass filter, a voltage controlled oscillator, and a feedback portion.

7. The apparatus of claim 6 wherein the phase-locked-loop clock further comprises a programmable delay line and a programmable gate each controllable to re-synchronize the phase-locked-loop clock with the period vernier test pattern generator if an output of the period vernier test pattern generator changes.

8. The apparatus of claim 1 further comprising a master timing reference signal supplied to each of the period vernier test pattern generator and the phase-looked-loop clock.

9. The apparatus of claim 1 wherein the phase-locked-loop clock further comprises one or more programmable dividers that are controllable to adjust the frequency of the phase-locked-loop clock output.

10. The apparatus of claim 9 wherein the one or more programmable dividers include a first divider arranged at a reference input signal side of a phase-locked-loop, a second divider arranged in the feedback portion of the phase-locked-loop, and a third divider arranged at an output side of the phase-locked-loop.

11. The apparatus of claim 10 wherein the first divider comprises a divide-by-M divider, the second divider comprises a divide-by-N divider and the third divider comprises a divide-by-D divider; wherein M, N and D are programmable integer coefficients, and the frequency of the test clock signal is controllable by choosing M, N and D to select a desired output frequency, Fout, according to the following equation $$Fout = Fref * \frac{N}{M*2*D}$$

where Fref is the reference input signal.

12. The apparatus of claim 11 wherein N corresponds to a period resolution.

13. The apparatus of claim 11 wherein N is 64.

14. The apparatus of claim 11 wherein D corresponds to a coarse frequency adjustment and M corresponds to a fine frequency adjustment.

15. The apparatus of claim 14 wherein D is a power of two.

16. A method of generating test signals comprising:
    generating test pattern signals using a programmable period vernier test pattern generator; and
    generating a test clock signal that is frequency-similar to and phase-matched with a predetermined cycle of the test pattern signals using a programmable phase-locked-loop.

17. The method of claim 16 further comprising applying the generated test pattern signals and the phase-matched test clock signal to a device under test.

18. The method of claim 17 wherein the generated test pattern signals are applied to data pins of the device under test and the frequency-similar and phase-matched test clock signal is applied to a clock input pin of the device under test.

19. The method of claim 16 wherein generating a phase-matched test clock signal comprises synchronizing the test clock signal to the test pattern signals using the programmable phase-locked loop.

20. The method of claim 19 wherein generating a phase-matched test clock signal further comprises generating the test pattern signals and the test clock signal based on a common master clock reference.

21. The method of claim 16 wherein generating the frequency-similar test clock signal comprises substantially matching a frequency of the test clock signal to a frequency of the test pattern signals.

22. The method of claim 21 wherein substantially matching the frequency of the test clock signal comprises controlling one or mote programmable dividers to adjust the test clock signal to be a multiple of a sub-multiple of the frequency of the test pattern signals.

23. The method of claim 16 wherein generating the frequency-similar test clock signal comprises controlling the frequency of the test clock signal by controlling a plurality of programmable dividers.

24. The method of claim 23 wherein controlling a plurality of programmable dividers comprises controlling a first divider arranged at a reference input signal side of a phase-locked-loop, controlling a second divider arranged in a feedback portion of the programmable phase-locked-loop, and controlling a third divider arranged at an output side of the programmable phase-locked-loop.

25. The method of claim 24 wherein the first divider is a divide-by-M divider, the second divider is a divide-by-N divider and the third divider is a divide-by-D divider, wherein M, N and D are programmable integer coefficients, and wherein controlling the frequency of the test clock signal comprises choosing M, N and D to select a desired output frequency, Fout, according to the following equation $$Fout = Fref * \frac{N}{M * 2 * D}$$

where Fref is the reference input signal.

26. The method of claim 25 wherein N corresponds to a period resolution.

27. The method of claim 26 wherein N is 64.

28. The method of claim 25 wherein D corresponds to a coarse frequency adjustment and M corresponds to a fine frequency adjustment.

29. The method of claim 28 wherein D is a power of two.

30. The method of claim 16 further comprising:
changing a frequency of the test pattern signals; and
adjusting the frequency of the test clock signal to match the changed frequency of the test pattern signals by re-programming one or more programmable dividers.

31. The method of claim 30 further comprising re-synchronizing the test clock signal with the test pattern signals by controlling a delay line or a gate or both to alter a timing of the test clock signal.

32. A method of generating test signals for a device under test, the method comprising:
generating a master reference signal;
using a vernier technique to generate test pattern signals based on the master reference signal;
generating a test clock signal that is phase-matched with and frequency similar to a predetermined cycle of the test pattern signals, the frequency similarity being accomplished by providing the master reference signal as input to a phase-locked loop and controlling one or more programmable dividers in the phase-locked-loop to adjust the test clock signal to be a multiple of a sub-multiple of a frequency of the test pattern signals, and the phase-matching being accomplished by providing a reset signal to the one or more programmable dividers to align the phase of the test clock signal and the test pattern signals;
applying the test clock signal to the clock input pin of the device under test; and
applying the test pattern signals to data pins of the device under test.

33. The method of claim 32 further comprising:
changing a frequency of the test pattern signals; and
adjusting the frequency of the test clock signal to calibrate to the changed frequency of the test pattern signals by re-programming the one or more programmable dividers.

34. The method of claim 32 wherein the phase-matching being further accomplished by calibrating the reset signal by controlling a delay line or a gate or both.

35. The method of claim 32 wherein controlling one or more programmable dividers comprises controlling a first divider arranged at a reference input signal side of the phase-locked-loop, controlling a second divider arranged in a feedback portion of the phase-locked-loop, and controlling a third divider arranged at an output side of the phase-locked-loop.

36. The method of claim 35 wherein the first divider is a divide-by-M divider, the second divider is a divide-by-N divider and the third divider is a divide-by-D divider, wherein M, N and D are programmable integer coefficients, and wherein controlling the frequency of the test clock signal comprises choosing M, N and D to select a desired output frequency, Fout, according to the following equation $$Fout = Fref * \frac{N}{M * 2 * D}$$

where Fref is the reference input signal.

* * * * *